United States Patent
Chava et al.

(10) Patent No.: US 7,504,897 B2
(45) Date of Patent: Mar. 17, 2009

(54) SWITCHED-CURRENT OSCILLATOR FOR CLOCK-FREQUENCY SPREADING

(75) Inventors: Chaitanya Chava, Whitehall, PA (US); Douglas D. Lopata, Boyertown, PA (US)

(73) Assignee: Agere Systems Inc., Allentown, PA (US)

( * ) Notice: Subject to any disclaimer, the term of this patent is extended or adjusted under 35 U.S.C. 154(b) by 183 days.

(21) Appl. No.: 11/589,351

(22) Filed: Oct. 30, 2006

(65) Prior Publication Data

US 2008/0130712 A1    Jun. 5, 2008

(51) Int. Cl.
H03B 29/00 (2006.01)

(52) U.S. Cl. .......................... 331/78; 331/111; 331/34; 327/156

(58) Field of Classification Search ................... 331/78, 331/34, 111; 327/156
See application file for complete search history.

(56) References Cited

U.S. PATENT DOCUMENTS

| | | | |
|---|---|---|---|
| 5,226,058 A | 7/1993 | Anderson et al. | 714/E11.018 |
| 6,687,319 B1 | 2/2004 | Perino et al. | 375/367 |
| 6,798,303 B2 | 9/2004 | Steinecke et al. | 331/78 |
| 6,980,039 B1 * | 12/2005 | Dening et al. | 327/164 |
| 7,015,733 B2 | 3/2006 | Giuroiu | 327/156 |
| 7,095,260 B2 * | 8/2006 | Miyata et al. | 327/156 |
| 7,098,709 B2 | 8/2006 | Ido et al. | 327/156 |

OTHER PUBLICATIONS

P. P. Chu and R. E. Jones, "Design Techniques of FPGA Based Random Number Generator," an abbreviated version of which first appeared in 1999 Proceedings of the Military and Aerospace Applications of Programming Devices and Techniques Conference.

\* cited by examiner

*Primary Examiner*—Arnold Kinkead
(74) *Attorney, Agent, or Firm*—Mendelsohn & Associates, P.C.; Yuri Gruzdkov; Steve Mendelsohn

(57) ABSTRACT

A switched-current oscillator having a dc current source adapted to charge a capacitor so that the capacitor charging time is controlled based on a sequence of (pseudo)randomly selected values, each of those values defining a corresponding charging time. A discharge device is adapted to discharge the capacitor if the voltage across the capacitor reaches a threshold voltage, at which point the next value in the sequence is selected to determine the next charging time. A square-wave clock signal having spread-spectrum characteristics is generated in the oscillator by using the series of charge-discharge cycles corresponding to the sequence of randomly selected values to toggle a flip-flop operating as a delay line and zero-order hold.

20 Claims, 5 Drawing Sheets

100

400

500

600

SWITCHED-CURRENT OSCILLATOR FOR CLOCK-FREQUENCY SPREADING

BACKGROUND OF THE INVENTION

1. Field of the Invention

The present invention relates to electronics and, more specifically, to circuits for implementing clock-frequency spreading.

2. Description of the Related Art

Spread-spectrum techniques in general are methods, in which energy generated in a narrow frequency band is deliberately spread over a wide frequency band. Frequency spreading can be done for a variety of reasons, e.g., to improve circuit robustness to electromagnetic interference (EMI) or jamming and to prevent hostile detection. In addition, as the speed of operation and degree of integration of electronic devices increase, the wavelengths of electromagnetic radiation generated within the electronic device decrease accordingly and become comparable with the size of wiring structures. As a result, the wiring structures can act as antennas capable of efficiently radiating and/or receiving unwanted electromagnetic radiation, which can cause high levels of EMI, severe deterioration of signal-to-noise ratios, and/or device malfunctions.

One spread-spectrum technique, called spread-spectrum clock generation (SSCG), is used in the design of synchronous digital circuits. A synchronous digital circuit is driven by a clock signal that provides for timing and synchronization. Typically, clock signals cause electromagnetic radiation on a plurality of relatively narrow bands located at the fundamental clock frequency and its harmonics. If left unabated, radiation levels might exceed the regulatory limits for EMI specified, e.g., by the Federal Communications Commission (FCC) in the United States, Japan Electronics and Information Technology Industries Association (JEITA) in Japan, and the International Electrotechnical Commission (IEC) in Europe.

With SSCG, the operating clock frequency is slightly varied to spread the radiated energy over one or more relatively wide frequency bands. The frequency variation is usually achieved through frequency or phase modulation, with the amount of EMI depending on the amplitude, frequency, and/or shape of the modulation signal. With the use of an appropriate modulation signal, the EMI level at any particular frequency can be reduced to an acceptable level. Representative prior-art circuits for implementing SSCG are disclosed in U.S. Pat. Nos. 7,098,709, 7,095,260, 7,015,733, 6,798,303, 6,687,319, and 5,226,058, all of which are incorporated herein by reference in their entirety. However, one problem with prior-art SSCG circuits is that they often draw a relatively large current, which might be disadvantageous, e.g., for portable cellular devices.

SUMMARY OF THE INVENTION

A switched-current oscillator having a dc current source is adapted to charge a capacitor so that the capacitor charging time is controlled based on a sequence of (pseudo) randomly selected values, each of those values defining a corresponding charging time. A discharge device is adapted to discharge the capacitor if the voltage across the capacitor reaches a threshold voltage, at which point the next value in the sequence is selected to determine the next charging time. A square-wave clock signal having spread-spectrum characteristics is generated in the oscillator by using the series of charge-discharge cycles corresponding to the sequence of randomly selected values to toggle a flip-flop operating as a delay line and zero-order hold. Advantageously, switched-current oscillators of the invention can be implemented to draw a relatively small current, e.g., less than about 1 µA, and programmed to generate fundamental clock frequencies in a relatively wide frequency range, e.g., from under 1 kHz to several MHz.

In one embodiment of the switched-current oscillator, the capacitor comprises a bank of capacitors, with at least one of the capacitors in the bank being adapted to be controllably engaged or disengaged based on the instant value in the sequence of randomly selected values. In another embodiment, the current source comprises an array of current sources, with at least one of the current sources in the array being adapted to be controllably engaged or disengaged based on the instant value. In yet another embodiment, the oscillator is adapted to set the threshold voltage based on the instant value.

According to one embodiment, the present invention is an apparatus comprising: (i) at least one capacitor; (ii) at least one current source adapted to charge the at least one capacitor; (iii) a discharge device adapted to discharge the at least one capacitor if a voltage across the at least one capacitor reaches a threshold voltage; and (iv) a control circuit adapted to control charging time in which the voltage across the at least one capacitor reaches the threshold voltage using a sequence of values, each randomly selected from a range of values, wherein the apparatus is adapted to generate a clock signal having spread-spectrum characteristics based on a series of charge-discharge cycles of the at least one capacitor corresponding to said sequence.

According to another embodiment, the present invention is a method of generating a clock signal having spread-spectrum characteristics, comprising: (i) randomly selecting a value from a range of values; (ii) charging at least one capacitor, wherein charging time in which a voltage across the at least one capacitor reaches a threshold voltage is determined by the selected value; (iii) discharging the at least one capacitor if the voltage across the at least one capacitor reaches the threshold voltage; and (iv) generating the clock signal based on a series of charge-discharge cycles of the at least one capacitor corresponding to a sequence of randomly selected values.

BRIEF DESCRIPTION OF THE DRAWINGS

Other aspects, features, and benefits of the present invention will become more fully apparent from the following detailed description, the appended claims, and the accompanying drawings in which:

DETAILED DESCRIPTION

Figure 1:
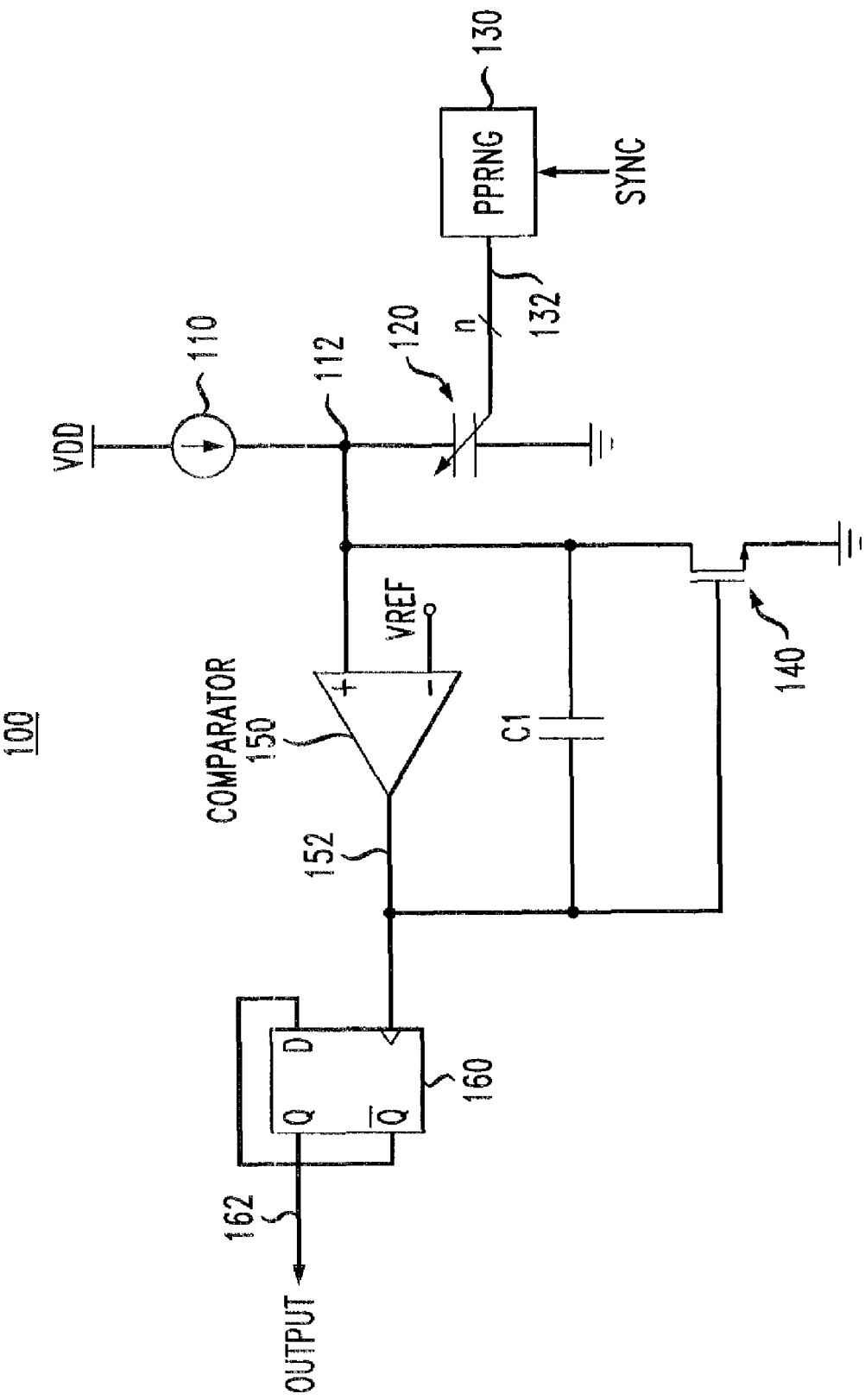
FIG. 1 shows a block diagram of a switched-current oscillator according to one embodiment of the invention.

FIG. 1 shows a block diagram of a switched-current oscillator 100 according to one embodiment of the invention. As further detailed below, oscillator 100 can be used to implement spread-spectrum clock generation. Oscillator 100 has a current source 110 serially connected with a variable capacitor 120 between two power supply terminals, e.g., VDD and ground, as indicated in FIG. 1. Source 110 generates a constant current ($I_0$) that charges capacitor 120. With a discharge device 140 (illustratively shown in FIG. 1 as a field-effect transistor) in the OFF state, the voltage across capacitor 120 ($V_{112}$) increases substantially linearly as expressed by Eq. (1):

$$\frac{dV_{112}}{dt} = \frac{I_0}{C_{120}} \quad (1)$$

where t is time and $C_{120}$ is the capacitance of capacitor 120.

Oscillator 110 has a comparator 150 that is configured to sense voltage $V_{112}$ and compare it with reference voltage $V_{REF}$. When voltage $V_{112}$ reaches reference voltage $V_{REF}$, comparator 150 generates an output signal 152 having a short pulse, which, for the pulse duration, turns ON discharge device 140. Capacitor C1 connected between one of the inputs of comparator 150 and the comparator's output provides positive feedback that helps the comparator to fully trip and to generate an appropriately shaped output pulse. With discharge device 140 in the ON state, capacitor 120 is quickly discharged to pull voltage $V_{112}$ down to zero (ground). At the trailing edge of the pulse generated by comparator 150, discharge device 140 is turned OFF and voltage $V_{112}$ begins to increase again in accordance with Eq. (1). The above-described sequence then repeats itself, causing voltage $V_{112}$ to go up and down in a sawtooth manner.

Signal 152 is applied to an edge-triggered D flip-flop 160, which operates as a delay line and zero-order hold. An output signal 162 generated by flip-flop 160 is a square wave having a duty cycle of substantially 50% and a fundamental frequency of one half the switching rate of comparator 150. As further detailed below, signal 162 can be used as a clock signal having spread-spectrum characteristics.

Oscillator 100 further includes a programmable pseudo-random-number generator (PPRNG) 130 configured to control the capacitance of capacitor 120. PPRNG 130 is a hardware unit that generates a stream of binary values that appear uncorrelated and satisfy a statistical test for randomness over a time period containing a statistically large number (e.g., $10^9$) of charge-discharge cycles for capacitor 120. However, if observed over a sufficiently large time interval (e.g., $10^{12}$ cycles), this stream of binary values will exhibit a repetitive and predictable pattern, which fact is underscored by the term "pseudo" in the name of PPRNG 130. Pseudo-random-number generators suitable for use as PPRNG 130 are known in the art, and some of them are described in detail in the article, submitted herewith, by P. P. Chu and R. E. Jones, entitled "Design Techniques of FPGA Based Random Number Generator," an abbreviated version of which first appeared in 1999 Proceedings of the Military and Aerospace Applications of Programming Devices and Techniques Conference, the teachings of which article are incorporated herein by reference.

In one embodiment, PPRNG 130 utilizes a multiple-bit leap-forward linear feedback shift register (LFSR) method for generating (pseudo) random numbers and incorporates a shift register, several XOR gates, and a relatively small combinational circuit. More details on suitable hardware implementations of the multiple-bit leap-forward LFSR method can be found, e.g., in the above-cited article by Chu and Jones. One skilled in the art will appreciate that other suitable methods for generating pseudo random numbers or true random numbers can also be used to implement a control circuit that can be used in place of PPRNG 130.

In one embodiment, capacitor 120 has a variability range from $C_-$ to $C_+$ (where $C_- < C_+$). PPRNG 130 generates an n-bit control signal 132 having a binary value randomly selected from the range between 0 and $2^n - 1$, with a fresh randomly selected binary value being applied to capacitor 120 each time comparator 150 is triggered. Based on the instant value of control signal 132, capacitor 120 is tuned to have a capacitance from the above specified variability range corresponding to that instant value. In one configuration, the capacitance of capacitor 120 is tuned in accordance with Eq. (2):

$$C_{120} = C_- + (C_+ - C_-)\frac{k}{2^n - 1} \quad (2)$$

where k is the instant value of control signal 132. One skilled in the art will appreciate that other suitable mappings between possible values of control signal 132 and the capacitance of capacitor 120 can also be used.

Figure 2:
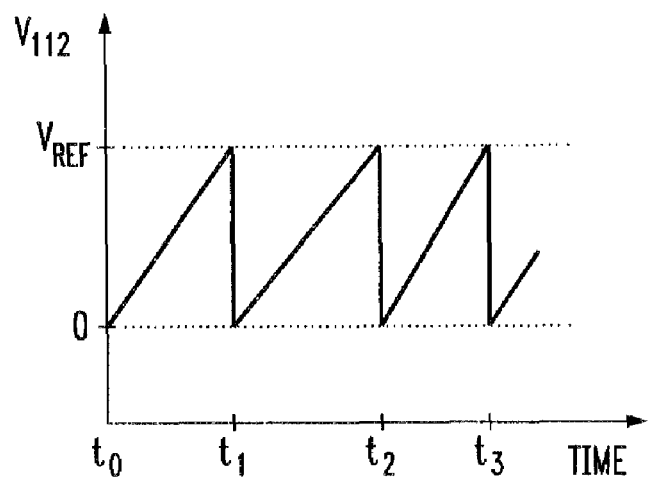
FIG. 2 graphically shows the evolution of voltage across the variable capacitor in the oscillator of FIG. 1 for three representative charge-discharge cycles.

FIG. 2 graphically shows voltage $V_{112}$ for three representative charge-discharge cycles of capacitor 120. During the first charge-discharge cycle ($t_0 < t < t_1$), capacitor 120 has capacitance $C_1$ defined by the corresponding value of control signal 132, and voltage $V_{112}$ is increasing with a slope (charging rate) of $I_0/C_1$. At time $t_1$, comparator 150 is triggered, capacitor 120 is discharged through discharge device 140, and PPRNG 130 refreshes control signal 132. During the second charge-discharge cycle ($t_1 < t < t_2$), capacitor 120 has capacitance $C_2$ defined by the refreshed value of control signal 132, where $C_2 > C_1$. Now, voltage $V_{112}$ is increasing slower than during the first charge-discharge cycle, with a slope of $I_0/C_2$. At time $t_2$, comparator 150 is triggered again, capacitor 120 is discharged through discharge device 140, and PPRNG 130 refreshes again control signal 132. During the third charge-discharge cycle ($t_2 < t < t_3$), capacitor 120 has capacitance $C_3$ defined by the last refreshed value of control signal 132, where $C_3 < C_1, C_2$. Now, voltage $V_{112}$ is increasing faster than during the first or second charge-discharge cycles, with a slope of $I_0/C_3$. At time $t_3$, comparator 150 is triggered again, and the sawtooth generation continues substantially as described above, with the voltage slopes (i.e., charging rates) for different charge-discharge cycles varying between $I_0/C_+$ and $I_0/C_-$, as defined by the corresponding randomly generated values of control signal 132.

Let us suppose that, at time $t_0$, output signal 162 is "high." Then, at time $t_1$, output signal 162 goes "low"; at time $t_2$, it goes "high" again; at time $t_3$, it goes "low" again, and so forth. The resulting fundamental frequency of signal 162 dithers in the range between about $I_0/2V_{REF}C_+$ and $I_0/2V_{REF}C_-$, thereby realizing spread-spectrum clock generation. Advantageously, oscillator 100 can be implemented to draw a relatively small current, e.g., less than about 1 µA, and programmed to generate fundamental clock frequencies from under 1 kHz to several MHz.

Figure 3:
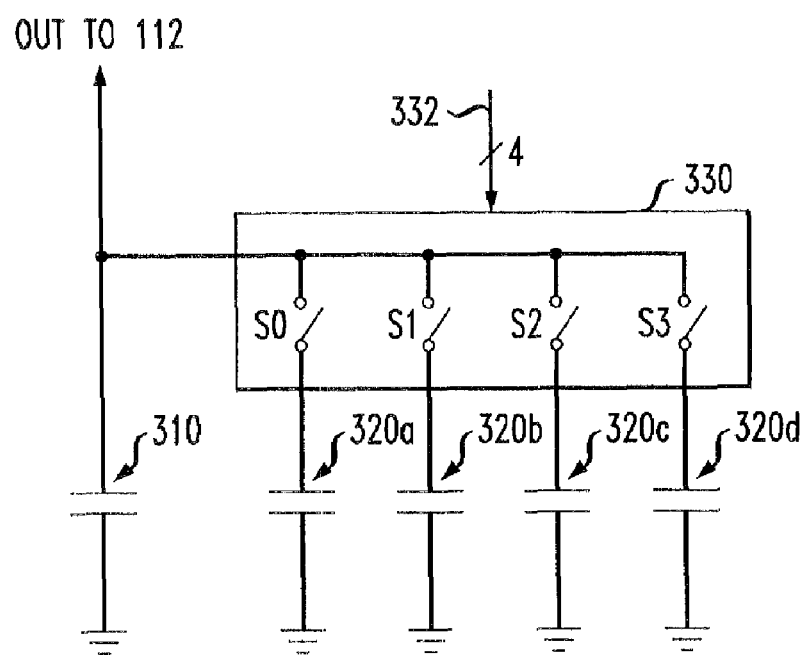
FIG. 3 shows a block diagram of a capacitor bank that can be used in the oscillator of FIG. 1 according to one embodiment of the invention.

FIG. 3 shows a block diagram of a capacitor bank 300 that can be used as variable capacitor 120 according to one embodiment of the invention. Capacitor bank 300 has a plurality of capacitors 310 and 320a-d connected in parallel as indicated in FIG. 3. Capacitor 310 is directly connected to the output line of capacitor bank 300, while capacitors 320a-d are connected to that line through an array of switches 330. Array 330 has switches S0-S3, each configured to control the connection of the respective one of capacitors 320a-d to the output line. The state of each of switches S0-S3 is determined by the corresponding bit of a 4-bit control signal 332 generated, e.g., by PPRNG 130 of FIG. 1. In one configuration, the states of switches S0-S3 are determined by the least significant, second, third, and most significant bits, respectively, of control signal 332, with each switch being in the closed (connected) state if the controlling bit is "one," and in the open (disconnected) state if the controlling bit is "zero."

In one embodiment, the capacitances of capacitors 320a-d have the following respective values: $C_{LSB}$, $2C_{LSB}$, $4C_{LSB}$, and $8C_{LSB}$, where $C_{LSB}$ is the capacitance of capacitor 320a. In other words, the capacitances of capacitors 320a-d form a geometric progression having a common ratio of two and a scaling factor of $C_{LSB}$. Accordingly, the capacitance variability range for capacitor bank 300 is defined by the following capacitance values:

$$C_- = C_{310} \tag{3a}$$

$$C_+ = C_{310} + 15 C_{LSB} \tag{3b}$$

where $C_{310}$ is the capacitance of capacitor 310. One skilled in the art will appreciate that, in other embodiments, other suitable relationships between the capacitances of capacitors 320a-d can also be used.

Figure 4:
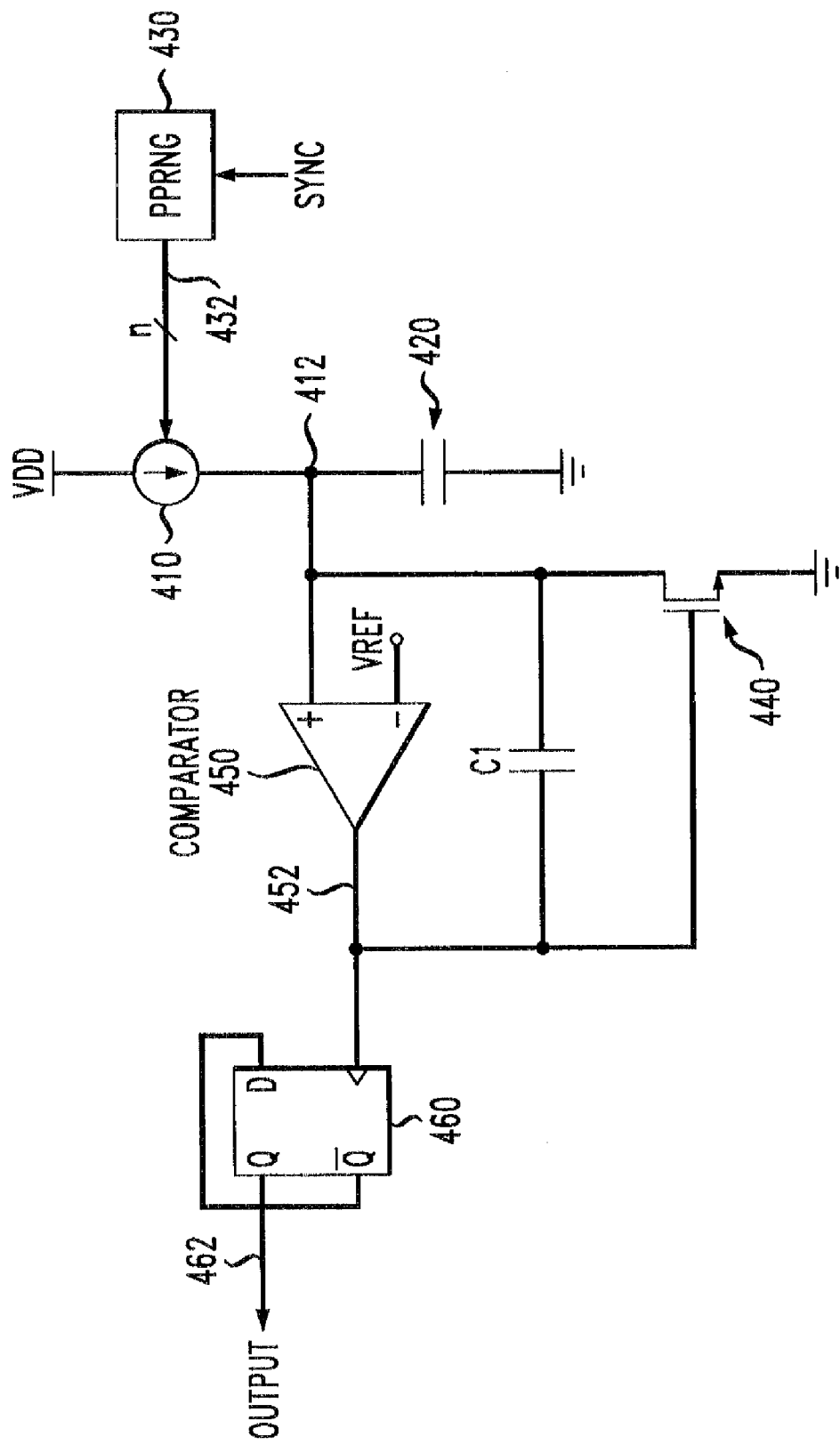
FIG. 4 shows a block diagram of a switched-current oscillator according to another embodiment of the invention.

FIG. 4 shows a block diagram of a switched-current oscillator 400 according to another embodiment of the invention. Similar to oscillator 100 of FIG. 1, oscillator 400 can be used to implement spread-spectrum clock generation. Oscillator 400 is generally analogous to oscillator 100, and analogous elements of the two oscillators are designated with labels having the same last two digits. However, two differences between oscillators 100 and 400 are that: (1) in the former oscillator, current source 110 is designed to generate a constant current while, in the latter oscillator, current source 410 is designed to have a capability to tune the generated dc current based on n-bit control signal 432 generated by PPRNG 430 and (2) in the former oscillator, capacitor 120 is a variable capacitor while, in the latter oscillator, capacitor 420 is a fixed capacitor.

In one embodiment, current source 410 has a variability range from $I_{low}$ to $I_{high}$. Based on the instant value of control signal 432, current source 410 is tuned to generate a dc current from this variability range, e.g., in accordance with Eq. (4):

$$I_{410} = I_{low} + (I_{high} - I_{low}) \frac{k}{2^n - 1} \tag{4}$$

where $I_{410}$ is the current generated by the current source and k is the instant value of the control signal. The resulting fundamental frequency of signal 462 dithers in the range between about $I_{low}/2V_{REF}C_{420}$ and $I_{high}/2V_{REF}C_{420}$, where $C_{420}$ is the capacitance of capacitor 420.

Figure 5:
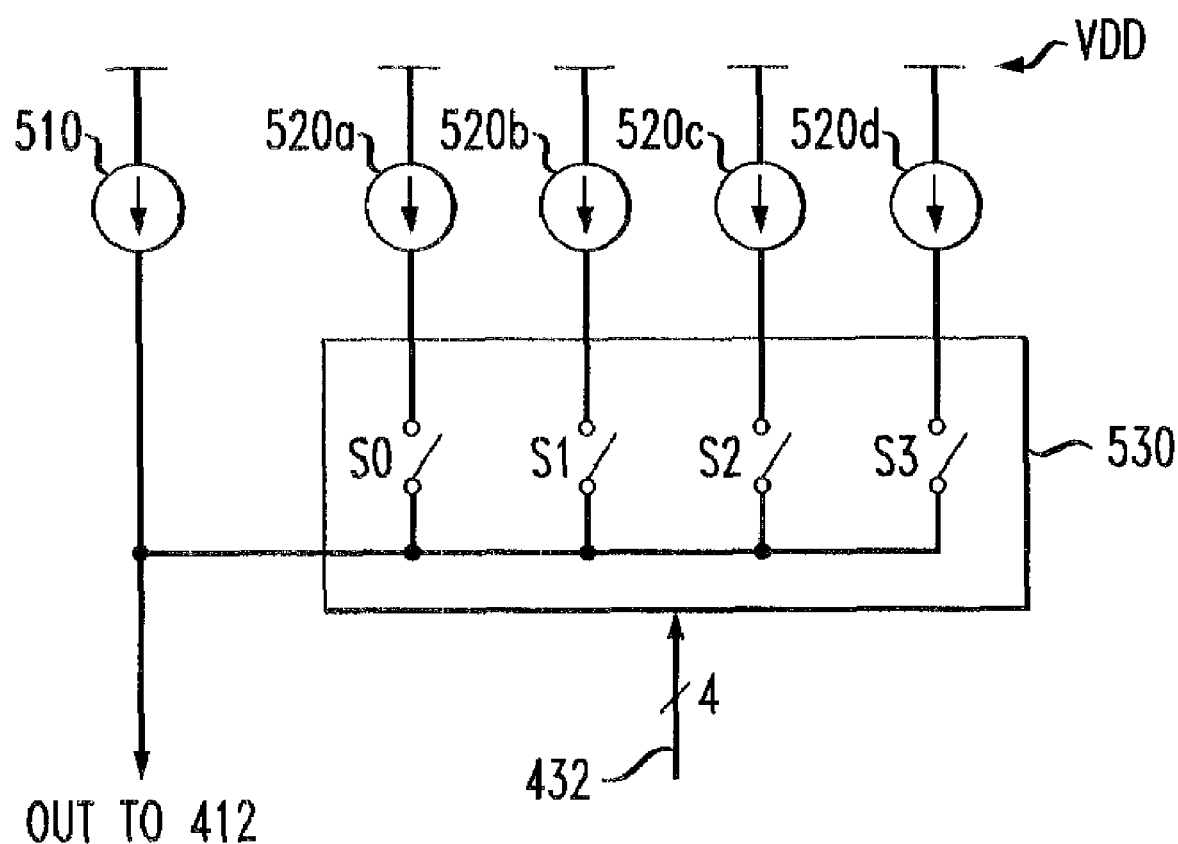
FIG. 5 shows a block diagram of a current-source array that can be used in the oscillator of FIG. 4 according to one embodiment of the invention.

FIG. 5 shows a block diagram of a current-source array 500 that can be used as current source 410 according to one embodiment of the invention. Current-source array 500 has a plurality of current sources 510 and 520a-d connected in parallel as indicated in FIG. 5. Current source 510 is directly connected to the output line of current-source array 500, while current sources 520a-d are connected to that line through an array of switches 530 that is analogous to array 330 of FIG. 3. Array 530 has switches S0-S3, each configured to control the connection of the respective one of current sources 520a-d to the output line. The states of switches S0-S3 are determined by the corresponding bits of control signal 432 (with n=4) generated by PPRNG 430 of FIG. 4.

In one embodiment, the currents generated by current sources 520a-d have the following respective values: $I_{LSB}$, $2I_{LSB}$, $4I_{LSB}$, and $8I_{LSB}$, where $I_{LSB}$ is the current generated by current source 520a. In other words, the currents generated by current sources 520a-d form a geometric progression having a common ratio of two and a scaling factor of $I_{LSB}$. The current-variability range for array 500 is defined by the following current values:

$$I_{low} = I_{510} \tag{5a}$$

$$I_{high} = I_{510} + 15 I_{LSB} \tag{5b}$$

where $I_{510}$ is the current generated by current source 510.

Figure 6:
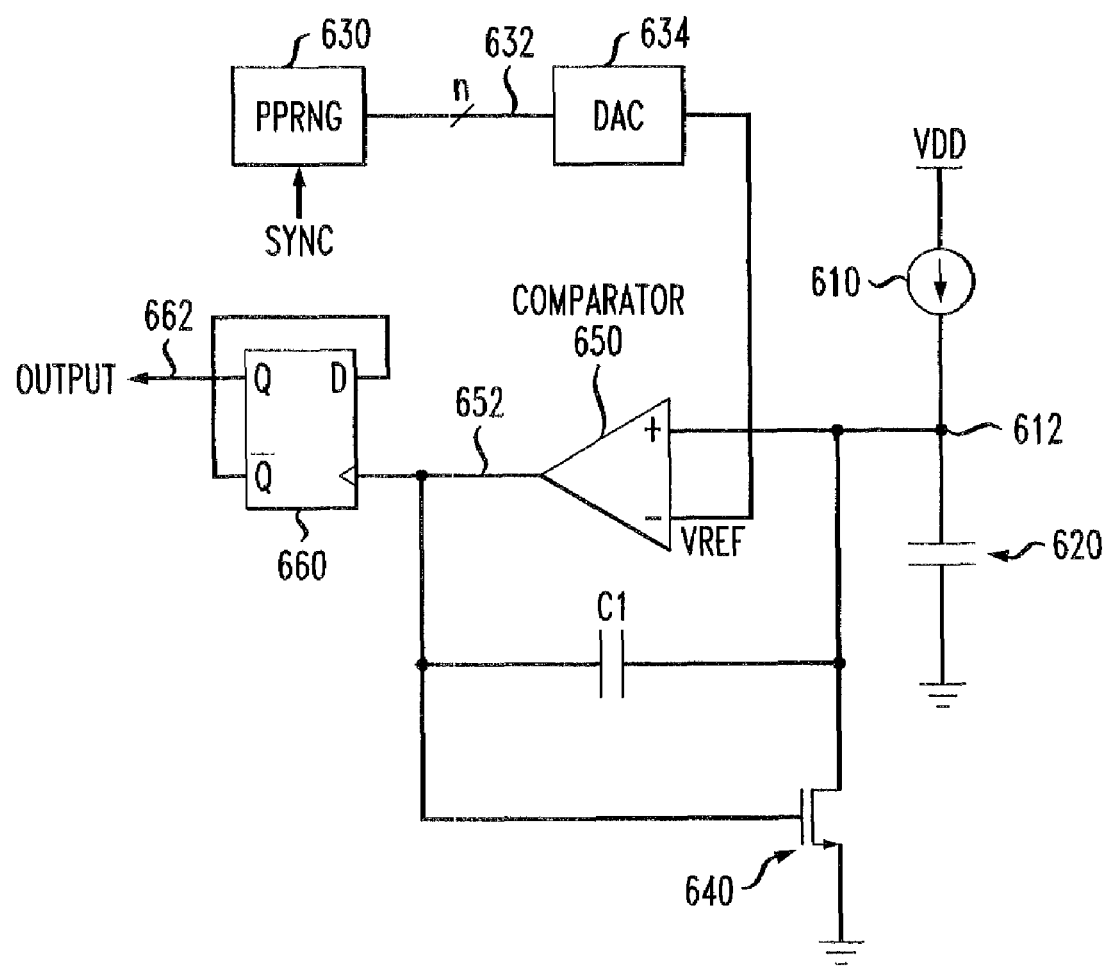
FIG. 6 shows a block diagram of a switched-current oscillator according to yet another embodiment of the invention.

FIG. 6 shows a block diagram of a switched-current oscillator 600 according to yet another embodiment of the invention. Oscillator 600 is generally analogous to oscillators 100 and 400, and analogous elements of these oscillators are designated with labels having the same last two digits. However, oscillator 600 differs from oscillators 100 and 400 in that: (1) neither current source 610 nor capacitor 620 is tunable and (2) PPRNG 630 is configured to modulate voltage $V_{REF}$ applied to comparator 650. To implement this modulation, oscillator 600 has a digital-to-analog converter (DAC) 634 that receives n-bit control signal 632 generated by PPRNG 630 and converts that signal into voltage $V_{REF}$, e.g., in accordance with Eq. (6):

$$V_{REF} = V_1 + (V_2 - V_1) \frac{k}{2^n - 1} \tag{6}$$

where $V_1$ and $V_2$ are constants and k is the instant value of the control signal. The resulting fundamental frequency of signal 662 dithers in the range between about $I_0/2V_2C_{620}$ and $I_0/2V_1C_{620}$, where $C_{620}$ is the capacitance of capacitor 620 and $I_0$ is the current generated by current source 610.

While this invention has been described with reference to illustrative embodiments, this description is not intended to be construed in a limiting sense. For example, an embodiment of an oscillator can have a variable capacitor as well as a tunable current source and/or a tunable reference voltage applied to the comparator. Within the context of this specification, the terms "random" and "pseudo-random" are used interchangeably, and the corresponding functions have substantially the same effect on the operation of oscillators of the invention. Various modifications of the described embodiments, as well as other embodiments of the invention, which are apparent to persons skilled in the art to which the invention pertains are deemed to lie within the principle and scope of the invention as expressed in the following claims.

The present invention may be implemented as circuit-based processes, including possible implementation on a single integrated circuit. As would be apparent to one skilled in the art, various functions of circuit elements may also be implemented as processing steps in a software program. Such software may be employed in, for example, a digital signal processor, micro-controller, or general-purpose computer.

Unless explicitly stated otherwise, each numerical value and range should be interpreted as being approximate as if the word "about" or "approximately" preceded the value of the value or range.

It will be further understood that various changes in the details, materials, and arrangements of the parts which have been described and illustrated in order to explain the nature of this invention may be made by those skilled in the art without departing from the scope of the invention as expressed in the following claims.

It should be understood that the steps of the exemplary methods set forth herein are not necessarily required to be performed in the order described, and the order of the steps of such methods should be understood to be merely exemplary. Likewise, additional steps may be included in such methods, and certain steps may be omitted or combined, in methods consistent with various embodiments of the present invention.

Although the elements in the following method claims, if any, are recited in a particular sequence with corresponding labeling, unless the claim recitations otherwise imply a particular sequence for implementing some or all of those elements, those elements are not necessarily intended to be limited to being implemented in that particular sequence.

Reference herein to "one embodiment" or "an embodiment" means that a particular feature, structure, or characteristic described in connection with the embodiment can be included in at least one embodiment of the invention. The appearances of the phrase "in one embodiment" in various places in the specification are not necessarily all referring to the same embodiment, nor are separate or alternative embodiments necessarily mutually exclusive of other embodiments. The same applies to the term "implementation."

We claim:

1. Apparatus, comprising:
   at least one capacitor that comprises a bank of capacitors;
   at least one current source adapted to charge the at least one capacitor;
   a discharge device adapted to discharge the at least one capacitor if a voltage across the at least one capacitor reaches a threshold voltage; and
   a control circuit adapted to control charging time in which the voltage across the at least one capacitor reaches the threshold voltage using a sequence of values, each randomly selected from a range of values, wherein:
   the apparatus is adapted to generate a clock signal having spread-spectrum characteristics based on a series of charge-discharge cycles of the at least one capacitor corresponding to said sequence; and
   at least one capacitor in the bank is adapted to be engaged or disengaged based on an instant value in said sequence.

2. The apparatus of claim 1, wherein the control circuit is adapted to generate said sequence by randomly selecting a value from said range each time the threshold voltage is reached.

3. The apparatus of claim 1, wherein each of said randomly selected values is a binary value that belongs to a continuous binary interval.

4. The apparatus of claim 1, wherein the bank of capacitors comprises:
   a first capacitor fixedly engaged to contribute to the total effective capacitance of the at least one capacitor; and
   a plurality of second capacitors, each adapted to be controllably engaged or disengaged based on the instant value to respectively contribute or not contribute to the total effective capacitance of the at least one capacitor.

5. The apparatus of claim 4, wherein the capacitances of the second capacitors form a geometric progression having a common ratio of about 2.

6. The apparatus of claim 1, wherein the at least one current source comprises an array of current sources, wherein at least one current source in the array is adapted to be engaged or disengaged based on an instant value in said sequence.

7. The apparatus of claim 6, wherein the array of current sources comprises:
   a first current source fixedly engaged to contribute to the current applied to the at least one capacitor; and
   a plurality of second current sources, each adapted to be controllably engaged or disengaged based on the instant value to respectively contribute or not contribute to the current applied to the at least one capacitor.

8. The apparatus of claim 7, wherein the second current sources are adapted to generate currents that form a geometric progression having a common ratio of about 2.

9. The apparatus of claim 1, wherein the control circuit is adapted to set the threshold voltage based on an instant value in said sequence.

10. The apparatus of claim 1, further comprising:
    a comparator adapted to turn ON the discharge device when the voltage across the at least one capacitor reaches the threshold voltage; and
    a flip-flop coupled to the comparator and adapted to generate the clock signal based on an output of comparator.

11. The apparatus of claim 1, wherein the clock signal is a square wave having a high-to-low or a low-to-high transition for each instance of the threshold voltage being reached by the voltage across the at least one capacitor.

12. The apparatus of claim 1, wherein the apparatus is implemented as part of an integrated circuit.

13. A method of generating a clock signal having spread-spectrum characteristics, comprising:
    randomly selecting a value from a range of values;
    charging at least one capacitor, wherein charging time in which a voltage across the at least one capacitor reaches a threshold voltage is determined by the selected value;
    discharging the at least one capacitor if the voltage across the at least one capacitor reaches the threshold voltage; and
    generating the clock signal based on a series of charge-discharge cycles of the at least one capacitor corresponding to a sequence of randomly selected values, wherein the at least one capacitor comprises a bank of capacitors, wherein the step of charging comprises engaging or disengaging at least one capacitor in the bank based on an instant value in said sequence.

14. The method of claim 13, comprising the step of repeating the step of randomly selecting each time the threshold voltage is reached to generate said sequence.

15. The method of claim 13, wherein, in the step of randomly selecting, each of said randomly selected values is a binary value that belongs to a continuous binary interval.

16. The method of claim 13, wherein the step of charging is performed using the bank of capacitors that comprises:
    a first capacitor fixedly engaged to contribute to the total effective capacitance of the at least one capacitor; and
    a plurality of second capacitors, each adapted to be controllably engaged or disengaged based on the instant value to respectively contribute or not contribute to the total effective capacitance of the at least one capacitor.

17. The method of claim 13, wherein the step of charging comprises applying currents generated by an array of current sources to the first capacitor, wherein at least one of the current sources in the array is adapted to be engaged or disengaged based on an instant value in said sequence.

18. The method of claim 13, further comprising setting the threshold voltage based on an instant value in said sequence.

19. Apparatus, comprising:
   at least one capacitor;
   at least one current source adapted to charge the at least one capacitor;
   a discharge device adapted to discharge the at least one capacitor if a voltage across the at least one capacitor reaches a threshold voltage; and
   a control circuit adapted to control charging time in which the voltage across the at least one capacitor reaches the threshold voltage using a sequence of values, each randomly selected from a range of values, wherein the apparatus is adapted to generate a clock signal having spread-spectrum characteristics based on a series of charge-discharge cycles of the at least one capacitor corresponding to said sequence, wherein the control circuit is adapted to set the threshold voltage based on an instant value in said sequence.

20. A method of generating a clock signal having spread-spectrum characteristics, comprising:
   randomly selecting a value from a range of values;
   charging at least one capacitor, wherein charging time in which a voltage across the at least one capacitor reaches a threshold voltage is determined by the selected value;
   discharging the at least one capacitor if the voltage across the at least one capacitor reaches the threshold voltage;
   generating the clock signal based on a series of charge-discharge cycles of the at least one capacitor corresponding to a sequence of randomly selected values; and
   setting the threshold voltage based on an instant value in said sequence.

* * * * *